US010203167B2

(12) United States Patent
Skaar et al.

(10) Patent No.: US 10,203,167 B2
(45) Date of Patent: Feb. 12, 2019

(54) MATCHING NETWORK COOLING BLOCK

(71) Applicant: ODYSSEY TECHNICAL SOLUTIONS, LLC, Round Rock, TX (US)

(72) Inventors: Daniel R. Skaar, Denver, CO (US); Chester Clayton Green, III, Georgetown, TX (US); Michael D. Pendley, Cedar Park, TX (US)

(73) Assignee: ODYSSEY TECHNICAL SOLUTIONS, LLC, Round Rock, TX (US)

( * ) Notice: Subject to any disclaimer, the term of this patent is extended or adjusted under 35 U.S.C. 154(b) by 175 days.

(21) Appl. No.: 14/834,902

(22) Filed: Aug. 25, 2015

(65) Prior Publication Data

US 2017/0064867 A1    Mar. 2, 2017

(51) Int. Cl.
*F28F 7/02* (2006.01)
*H05K 7/20* (2006.01)
*F28F 3/12* (2006.01)

(52) U.S. Cl.
CPC .................. *F28F 7/02* (2013.01); *F28F 3/12* (2013.01); *H05K 7/20254* (2013.01); *H05K 7/20272* (2013.01)

(58) Field of Classification Search
CPC ........... F28F 3/12; F28F 7/02; F28F 2280/105
See application file for complete search history.

(56) References Cited

U.S. PATENT DOCUMENTS

| | | | | |
|---|---|---|---|---|
| 1,549,464 | A * | 8/1925 | Dinzl ................... | B30B 15/064 165/168 |
| 5,855,933 | A * | 1/1999 | Schmetz ................. | B29C 33/04 228/174 |
| 6,336,283 | B1 * | 1/2002 | Ortiz ....................... | F41A 17/02 42/69.01 |
| 7,768,784 | B2 * | 8/2010 | Lai ....................... | H01L 23/4093 165/104.33 |
| 7,913,969 | B2 * | 3/2011 | Stec ...................... | B61D 45/006 248/201 |
| 2005/0284611 | A1 * | 12/2005 | Bibeau ..................... | F28F 3/12 165/104.21 |
| 2006/0118279 | A1 * | 6/2006 | Stafford .................. | F28D 1/024 165/104.33 |
| 2009/0294105 | A1 * | 12/2009 | Sundararajan ........ | H01L 23/473 165/104.33 |
| 2014/0139056 | A1 * | 5/2014 | Tseng ....................... | F28F 7/02 310/54 |

* cited by examiner

*Primary Examiner* — Hung Q Nguyen
*Assistant Examiner* — Mark L. Greene
(74) *Attorney, Agent, or Firm* — Larson Newman, LLP; Ross D. Snyder

(57) ABSTRACT

A cooling block and method therefor are provided. The cooling block defines a plurality of straight channels, the straight channels including an inlet channel, a diagonal channel, a transverse channel, and an outlet channel, the straight channels being serially communicative to provide a continuous path for coolant flow, wherein the diagonal channel meets the transverse channel at an acute angle at a diagonal and transverse channel junction.

20 Claims, 7 Drawing Sheets

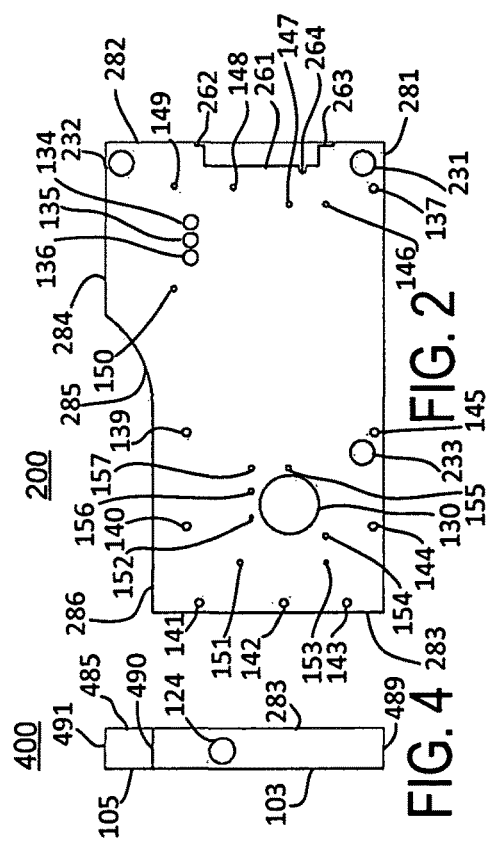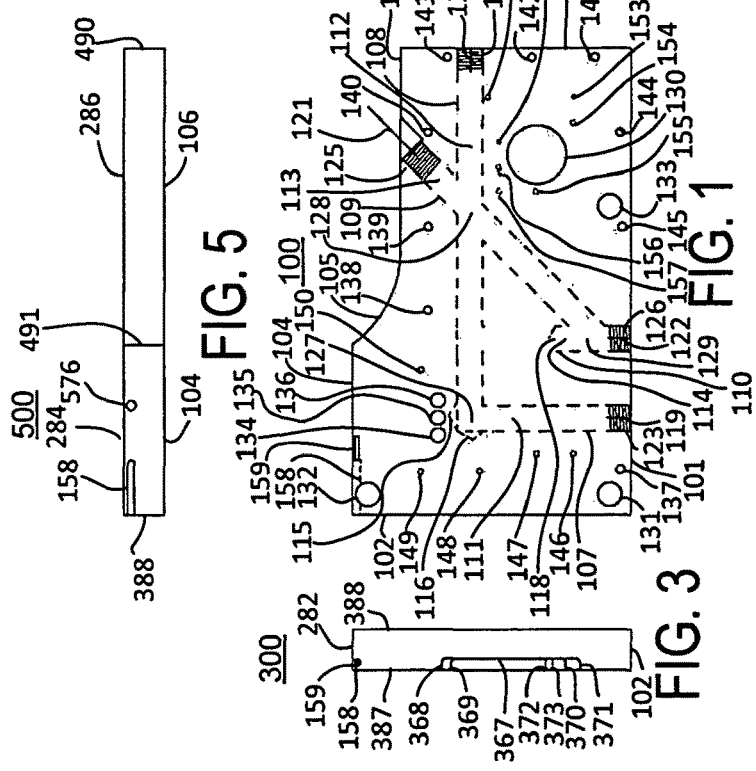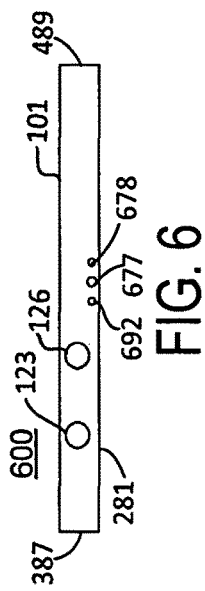

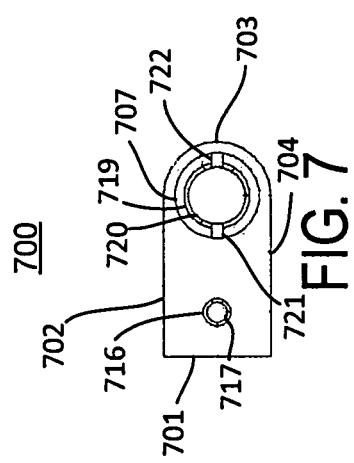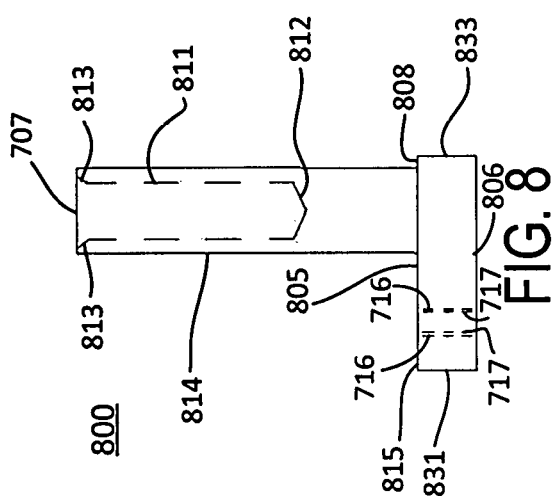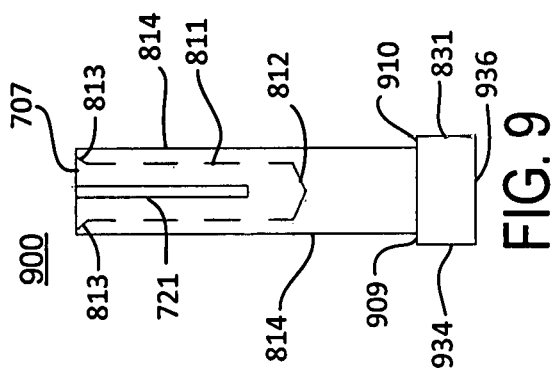

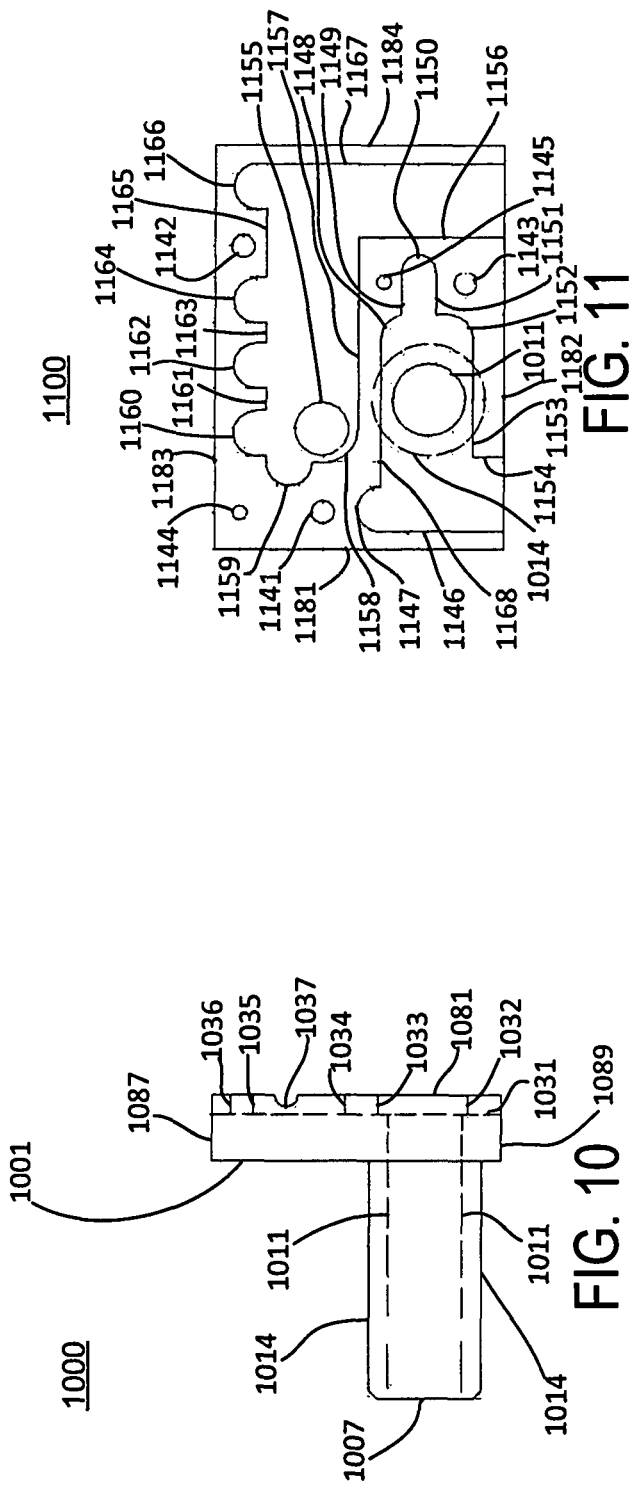

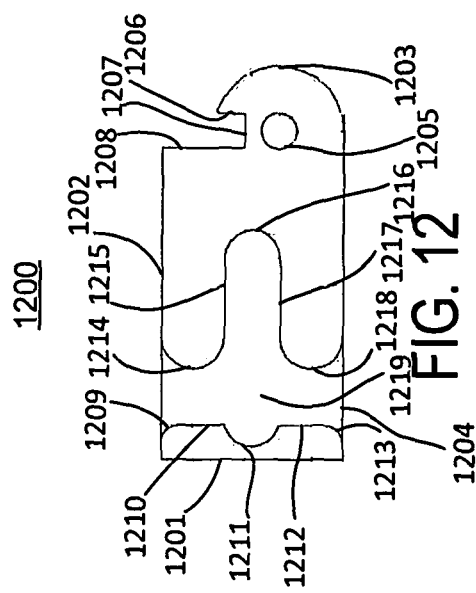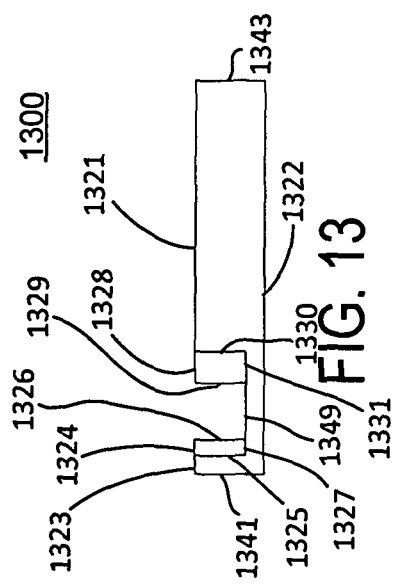

MATCHING NETWORK COOLING BLOCK

BACKGROUND

Field of the Disclosure

A power source, for example, a radio frequency (RF) generator, produces an output having an output impedance. A load having an input impedance receives the output from the power source. As one example, a power source may provide power to be delivered to a plasma chamber wherein plasma may be produced from the power. Ideally, the input impedance would be perfectly matched to the output impedance to maximize power transfer from the power source to the load. However, practically, a matching network is provided between the output of the power source and an input of the load to provide impedance matching from the output to the input. Ideally, the matching network would be perfectly efficient and provide all of the power received from the output to the input. However, practically, some power is lost in the matching network and dissipated as heat. While the heat can be removed from the matching network to some degree, some effects from the heat can be problematic. As an example, as power sources are upgraded over time, newer power sources may be capable of producing more power than older power sources, which can result in more heating of a matching network. As another example, thermal cycling of the matching network and the associated expansion and contraction of its components, which may occur in differing amounts based on different thermal expansion coefficients of the different components, can lead to failures, such as solder joint failures. Such failures can be catastrophic to the matching network, given the amount of power provided by the power source.

BRIEF DESCRIPTION OF THE DRAWINGS

The present disclosure may be better understood, and its numerous features and advantages made apparent to those skilled in the art by referencing the accompanying drawings.

FIG. 1 is a bottom view of a multiview orthographic projection diagram of a cooling block in accordance with at least one embodiment.

FIG. 2 is a top view of a multiview orthographic projection diagram of a cooling block in accordance with at least one embodiment.

FIG. 3 is a right side view of a multiview orthographic projection diagram of a cooling block in accordance with at least one embodiment.

FIG. 4 is a left side view of a multiview orthographic projection diagram of a cooling block in accordance with at least one embodiment.

FIG. 5 is a rear end view of a multiview orthographic projection diagram of a cooling block in accordance with at least one embodiment.

FIG. 6 is a front end view of a multiview orthographic projection diagram of a cooling block in accordance with at least one embodiment.

FIG. 7 is a bottom view of a multiview orthographic projection diagram of an extended coaxial input connector conductor to accommodate a cooling block in accordance with at least one embodiment.

FIG. 8 is a left side view of a multiview orthographic projection diagram of an extended coaxial input connector conductor to accommodate a cooling block in accordance with at least one embodiment.

FIG. 9 is a front end view of a multiview orthographic projection diagram of an extended coaxial input connector conductor to accommodate a cooling block in accordance with at least one embodiment.

FIG. 10 is a front end view of a multiview orthographic projection diagram of an extended coaxial input connector lower dielectric housing portion to accommodate a cooling block in accordance with at least one embodiment.

FIG. 11 is a top view of a multiview orthographic projection diagram of an extended coaxial input connector lower dielectric housing portion to accommodate a cooling block in accordance with at least one embodiment.

FIG. 12 is a front end view of a multiview orthographic projection diagram of a rear extended mounting bracket to accommodate a cooling block in accordance with at least one embodiment.

FIG. 13 is a right side view of a multiview orthographic projection diagram of a rear extended mounting bracket to accommodate a cooling block in accordance with at least one embodiment.

The use of the same reference symbols in different drawings indicates similar or identical items.

DETAILED DESCRIPTION OF THE DRAWINGS

Figure 14:
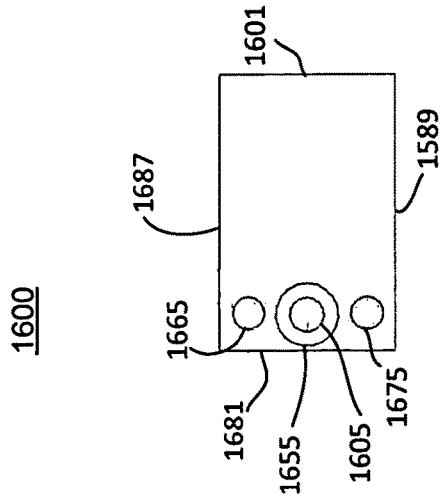
FIG. 14 is a rear end view of a multiview orthographic projection diagram of a front extended mounting bracket to accommodate a cooling block in accordance with at least one embodiment.

A cooling block for a matching network is provided. The cooling block may be used to cool, for example, a matching network between a RF generator and a load. The cooling block provides passages in which a coolant may flow. The cooling block can remove heat from the matching network, and the coolant can remove heat from the cooling block. The passages are defined within the cooling block. The passages are defined so as to contain a straight inlet coolant channel, a straight diagonal coolant channel, a straight transverse coolant channel, and a straight outlet coolant channel. The straight inlet coolant channel is in communication with the straight diagonal coolant channel. The straight diagonal coolant channel is in communication with the straight transverse coolant channel. The straight transverse coolant channel is in communication with the straight outlet channel.

FIG. 1 is a bottom view of a multiview orthographic projection diagram of a cooling block in accordance with at least one embodiment. For proper orientation relative to the other views of the multiview orthographic projection diagram of FIGS. 1-6, FIG. 1 is shown with what is described as the left side of the cooling block on the right in the drawing and what is described as the right side of the cooling block on the left in the drawing. The bottom view 100 of FIG. 1 depicts bottom front edge 101, bottom right edge 102, bottom left edge 103, bottom rear edge 104, bottom rear radiused edge 105, and bottom rear relieved edge 106. A continuous coolant path is provided via straight inlet channel 114, straight diagonal channel 113, straight transverse channel 112, and straight outlet channel 111. The surfaces of the coolant path are shown in broken lines, as the channels for the coolant are internal to the cooling block, containing the relevant portion of the coolant path within the cooling block.

Bored inlet internal surface 110 is defined in the interior of the cooling block. Extending along inlet bore axis 122 from a front surface of cooling block rearward, a bored inlet internal surface 110 of straight inlet channel 114 is defined in the interior of the cooling block, for example, by drilling a hole. A threaded inlet port 126 is provided at a proximal end of bored inlet internal surface 110. A threaded inlet fitting may be connected to threaded inlet port 126 to provide an inlet through which coolant may be introduced into the cooling block. In accordance with at least one embodiment, the hole extends to a depth of conical inlet channel terminus 118 at a distal end of bored inlet internal surface 110. The bored inlet internal surface 110 intersects with a bored diagonal internal surface 109 at inlet and diagonal channel junction 129 near the distal end of bored inlet internal surface 110 at an obtuse angle with respect to the path of coolant flow.

Bored diagonal internal surface 109 is defined in the interior of the cooling block. Bored diagonal internal surface 109 of straight diagonal channel 113 extends along diagonal bore axis 121 from a relieved rear surface of the cooling block diagonally to the depth at which its distal end intersects bored inlet internal surface 110 at inlet and diagonal channel junction 129. Bored diagonal internal surface 109 may be formed, for example, by drilling a hole. The proximal end of straight diagonal channel 113 is threaded. Diagonal channel threaded plug 125 is installed to seal the proximal end of straight diagonal channel 113. Near the proximal end of straight diagonal channel 113, bored diagonal internal surface 109 intersects bored transverse internal surface 108 of straight transverse channel 112 at diagonal and transverse channel junction 128. Diagonal bore axis 121 meets transverse bore axis 120 at an acute angle. The acute angle helps introduce turbulence in the coolant flowing from straight diagonal channel 113 to straight transverse channel 112. For example, the sharp corner formed by the intersection of straight diagonal channel 113 and straight transverse channel 112 can create a separation layer and therefore promote turbulence in the straight transverse channel 112 by creating a mixture of cool and warm eddy currents and providing better heat distribution throughout the cooling medium. The dead ended channel portion of straight diagonal channel 113 between diagonal and transverse channel junction 128 and diagonal channel threaded plug 125 helps introduce turbulence in the coolant flowing from straight diagonal channel 113 to straight transverse channel 112. The dead ended channel portion of straight transverse channel 112 between diagonal and transverse channel junction 128 and transverse channel threaded plug 124 helps introduce turbulence in the coolant flowing from straight diagonal channel 113 to straight transverse channel 112.

Bored transverse internal surface 108 is defined in the interior of the cooling block. Bored transverse internal surface 108 of straight transverse channel 112 extends along transverse bore axis 120 from a left surface of the cooling block transversely to a depth of conical transverse channel terminus 116. Bored transverse internal surface 108 may be formed, for example, by drilling a hole. The proximal end of straight transverse channel 112 is threaded. Transverse channel threaded plug 124 is installed to seal the proximal end of straight transverse channel 112. Along straight transverse channel 112, bored transverse internal surface 108 intersects bored diagonal internal surface 109. Near conical transverse channel terminus 116, bored transverse internal surface 108 intersects bored outlet internal surface 107 of straight outlet channel 111.

Bored outlet internal surface 107 of straight outlet channel 111 is defined in the interior of the cooling block. Bored outlet internal surface 107 may be formed, for example, by drilling a hole. In accordance with at least one embodiment, the hole extends along outlet bore axis 119 to a depth of conical outlet channel terminus 115. A distal end of bored outlet internal surface 107 intersects with bored transverse internal surface 108 at transverse and outlet channel junction 127, which is near conical outlet channel terminus 115 and conical transverse channel terminus 116. A proximal end of bored outlet internal surface 107 is threaded to provide threaded outlet port 123. An outlet fitting may be connected to threaded outlet port 123 to provide an outlet for coolant flowing within the cooling block.

A coaxial input connector aperture 130 is defined in the cooling block. The aperture can be, for example, a circular aperture extending from a bottom surface to a top surface of the cooling block. Coaxial input connector aperture 130 is situated between straight diagonal channel 113 and the left surface of the cooling block and between straight transverse channel 112 and the front surface of the cooling block.

In accordance with at least one embodiment, the power source can be a RF generator used to produce plasma in a plasma chamber, wherein the load comprises the plasma. Captive screw assemblies are installed the cooling block to facilitate connection of the cooling block and the adapter to which it can be attached to a plasma chamber. The adapter may be, for example, an adapter comprising a fixed impedance matching network, for example, a multi-function adapter (MFA) for serving as a impedance matching network between a RF generator and a plasma chamber. As examples, MFAs are designed for specific targeted plasma impedances and are most often used in conjunction with chemical vapor deposition (CVD) fabrication tools for manufacturing electronic devices on semiconductor wafers. The captive screw assemblies each comprise a captive screw, a spring, and a collar. The collar may be press fit, for example, into holes defined in the cooling block. As an example, a front right captive screw assembly 131, a rear right captive screw assembly 132, and a front left captive screw assembly 133 can be installed in the cooling block. A plurality of light emitting diodes (LEDs) on, for example, a plasma generator are visible through a plurality of LED viewing ports 134, 135, and 136 and may be viewed, for example, to determine the status of the plasma generator. LED viewing ports 134, 135, and 136 are defined through the cooling block from the bottom surface to the top surface of the cooling block. LED viewing ports 134, 135, and 136 are arranged to be adjacent to one another along a line parallel to and near to transverse bore axis 120. LED viewing ports 134, 135, and 136 lie near and to the rear of conical outlet channel terminus 115. The diameter of each of LED viewing ports 134, 135, and 136 can be approximately 5 mm.

A plurality of mounting holes are defined in the cooling block to the adapter. The mounting holes can include, for example, mounting holes 137-157. One or more of the mounting holes may be used for threaded fasteners. Such mounting holes may be threaded. One or more of the mounting holes may be used to receive dowel pins to provide alignment of the cooling block with the adapter.

The cooling block can define a locking mechanism slot 158 and a locking mechanism hole 159. Locking mechanism slot 158 and locking mechanism hole 159 can receive a locking mechanism. As an example, the locking mechanism can be used to lock a pivoting extended mounting bracket, such as the rear extended mounting bracket described below with respect to FIGS. 12 and 13.

FIG. 2 is a top view of a multiview orthographic projection diagram of a cooling block in accordance with at least one embodiment. The top view 200 of FIG. 2 depicts top front edge 281, top right edge 282, top left edge 283, top rear edge 284, top rear radiused edge 285, and top rear relieved edge 286. FIG. 2 shows a top view of coaxial input connector aperture 130 of FIG. 1, as defined in the cooling block. The cooling block defines front right captive screw assembly hole 231, rear right captive screw assembly hole 232, and front left captive screw assembly hole 233, which provide a top view of holes for front right captive screw assembly 131, rear right captive screw assembly 132, and front left captive screw assembly 133, as shown in FIG. 1, respectively. The cooling block defines LED viewing ports 134, 135, and 136, which correspond to LED viewing ports 134, 135, and 136, respectively, of the bottom view of FIG. 1. Mounting holes 137-157, as shown in the top view of FIG. 2, correspond, respectively, to mounting holes 137-157, as shown in the bottom view of FIG. 1.

FIG. 2 shows a relieved cavity to provide clearance for an electrical connector. The relieved cavity is defined by top right center relieved cavity edge 261, top right rear relieved cavity edge 262, top right front relieved cavity edge 263, and top right notched relieved cavity edge 264.

FIG. 3 is a right side view of a multiview orthographic projection diagram of a cooling block in accordance with at least one embodiment. Right side view 300 shows bottom right edge 102, top right edge 282, front right edge 387, and rear right edge 388. Locking mechanism slot 158 and locking mechanism hole 159 represent the right side view of locking mechanism slot 158 and locking mechanism hole 159 shown in the bottom view of FIG. 1.

Aspects of the relieved cavity described with respect to FIG. 2 above are shown in FIG. 3. The relieved cavity is defined by right top relieved cavity edge 367, right top rear lateral relieved cavity edge 368, right top rear medial relieved cavity edge 369, right top front medial relieved cavity edge 370, right top front lateral relieved cavity edge 371, right top notched medial relieved cavity edge 372, and right top notched lateral relieved cavity edge 373.

FIG. 4 is a left side view of a multiview orthographic projection diagram of a cooling block in accordance with at least one embodiment. Left side view 400 shows bottom left edge 103, bottom rear radiused edge 105, top left edge 283, top rear radiused edge 485, front left edge 489, rear left edge 490, and rear left relieved edge 491. Transverse channel threaded plug 124 is shown in FIG. 4 as a left side view of transverse channel threaded plug 124 of FIG. 1.

FIG. 5 is a rear end view of a multiview orthographic projection diagram of a cooling block in accordance with at least one embodiment. Rear end view 500 shows bottom rear edge 104, bottom rear relieved edge 106, top rear edge 284, top rear relieved edge 286, rear right edge 388, rear left edge 490, and rear left relieved edge 491. Also visible in FIG. 5 is locking mechanism slot 158, which is shown as a rear end view of locking mechanism slot 158 of FIG. 1 and FIG. 3. Rear mounting bracket hole 576 is defined in the cooling block.

FIG. 6 is a front end view of a multiview orthographic projection diagram of a cooling block in accordance with at least one embodiment. Front end view 600 shows bottom front edge 101, top front edge 281, front right edge 387, and front left edge 489. Threaded output port 123 and threaded input port 126 are visible in front view 600 of FIG. 6. Front right bracket mounting hole 692, front center bracket mounting hole 677, and front left bracket mounting hole 678 are shown in front view 600 of FIG. 6.

Exemplary dimensions in accordance with at least one embodiment can include those set forth below. A width of the front face of the cooling block, as shown in FIG. 6, can be between 190.5 millimeters (7.5 inches) and 215.9 millimeters (8.5 inches), such as between 200.66 millimeters (7.9 inches) and 205.74 millimeters (8.1 inches), such as between 202.819 millimeters (7.985 inches) and 205.359 millimeters (8.085 inches). A width of a rear flat face of the cooling block, as shown bounded by bottom rear edge 504, top rear edge 584, rear right edge 588, and rear left relieved edge 591, can be between 63.5 millimeters (2.5 inches) and 88.9 millimeters (3.5 inches), such as between 71.12 millimeters (2.8 inches) and 78.74 millimeters (3.1 inches), such as between 73.279 millimeters (2.885 inches) and 75.819 millimeters (2.985 inches). A radius of bottom rear radiused edge 105 of FIG. 1 and top rear radiused edge 285 of FIG. 2 can be between 38.1 millimeters (1.5 inches) and 63.5 millimeters (2.5 inches), such as between 48.26 millimeters (1.9 inches) and 53.34 millimeters (2.1 inches), such as between 49.53 millimeters (1.95 inches) and 52.07 millimeters (2.05 inches). A length of the left face of the cooling block, as shown in FIG. 4, bounded by bottom left edge 403, top left edge 483, front left edge 489, and rear left edge 490, can be between 88.9 millimeters (3.5 inches) and 114.3 millimeters (4.5 inches), such as between 99.06 millimeters (3.9 inches) and 104.14 millimeters 0.1 inches), such as between 99.441 millimeters (3.915 inches) and 101.981 millimeters (4.015 inches). A length of the right face of the cooling block, as shown in FIG. 3, can be between 109.22 millimeters (4.3 inches) and 134.62 millimeters (5.3 inches), such as between 116.84 millimeters (4.6 inches) and 124.46 millimeters (4.9 inches), such as between 120.269 millimeters (4.735 inches) and 122.809 millimeters (4.835 inches). A height of the cooling block, as shown in FIGS. 5 and 6, can be between 12.7 millimeters (0.5 inches) and 22.86 millimeters (0.9 inches), such as between 15.24 millimeters (0.6 inches) and 20.32 millimeters (0.8 inches), such as between 16.51 millimeters (0.65 inches) and 19.05 millimeters (0.75 inches). Inlet bore axis 122 can intersect diagonal bore axis 121 at an obtuse angle, such as an angle between 120 and 150 degrees, such as between 130 and 140 degrees, such as between 134 and 136 degrees. Diagonal bore axis 121 can intersect transverse bore axis 120 at an acute angle, such as an angle between 30 and 60 degrees, such as between 40 and 50 degrees, such as between 44 and 46 degrees. Transverse bore axis 120 can intersect outlet bore axis 119 at an angle between 75 and 105 degrees, such as between 80 and 100 degrees, such as between 85 and 95 degrees, such as between 89 and 91 degrees. Inlet bore axis 122 and outlet bore axis 119 can be spaced apart from each other along the front face of the cooling block by a distance of between 30.48 millimeters (1.2 inches) and 38.1 millimeters (1.5 inches), such as between 33.02 millimeters (1.3 inches) and 35.56 millimeters (1.4 inches), such as between 33.5788 millimeters (1.322 inches) and 36.1188 (1.422 inches). Transverse bore axis 120 can be set back a distance from the front face of the cooling block between 58.42 millimeters (2.3 inches) and 83.82 millimeters (3.3 inches), such as between 66.04 millimeters (2.6 inches) and 73.66 millimeters (2.9 inches), such as between 68.834 millimeters (2.71 inches) and 71.374 millimeters (2.81 inches).

FIG. 7 is a bottom view of a multiview orthographic projection diagram of an extended coaxial input connector conductor to accommodate a cooling block in accordance with at least one embodiment. Bottom view 700 depicts bottom front edge 701, bottom right edge 702, bottom rear radiused edge 703, bottom left edge 704, and bottom circular conductor edge 707 of the extended coaxial input connector conductor. A threaded hole is defined in the extended coaxial input connector conductor to allow an electrical connection, for example, a conductive strap to connect the extended coaxial input connector conductor to an input of the fixed impedance matching network. The threaded hole has an outer threaded hole surface diameter 716 and an inner threaded hole surface diameter 717. A conically beveled surface is provided at the bottom of the extended coaxial input connector conductor to facilitate insertion of a connector pin into the extended coaxial input connector conductor. Bottom beveled inner center conductor edge 719 and inner cylindrical conductor surface 720 are shown in FIG. 7. The extended coaxial input connector conductor is relieved by defining longitudinal slots. Such slots can provide spring tension to retain the connector pin within the extended coaxial input connector conductor. The longitudinal slots are illustrated by front conductor relieved region 721 and rear conductor relieved region 722 of FIG. 7.

FIG. 8 is a left side view of a multiview orthographic projection diagram of an extended coaxial input connector conductor to accommodate a cooling block in accordance with at least one embodiment. Left side view 800 depicts bottom left base edge 805, top left base edge 806, bottom circular conductor edge 707, bottom rear base surface 808, inner cylindrical conductor surface 811, conical inner conductor surface terminus 812, bottom inner conductor beveled surface 813, outer cylindrical conductor surface 814, bottom front base surface 815, outer threaded hole surface diameter 716, inner threaded hole surface diameter 717, front right base edge 831, and rear radiused base surface 833.

FIG. 9 is a front end view of a multiview orthographic projection diagram of an extended coaxial input connector conductor to accommodate a cooling block in accordance with at least one embodiment. Front end view 900 depicts bottom circular conductor edge 707, bottom right base surface 909, bottom left base surface 910, inner cylindrical conductor surface 811, conical inner conductor surface terminus 812, bottom inner conductor beveled surface 813, outer cylindrical conductor surface 814, front conductor relieved region 721, front left base edge 831, front right base edge 934, and front top base edge 936.

Exemplary dimensions in accordance with at least one embodiment can include those set forth below. A height of the extended coaxial input connector, from bottom circular conductor edge 707 to top left base edge 806 of FIG. 8 and from bottom circular conductor edge 707 to front top base edge 936 of FIG. 9, can be between 40.64 millimeters (1.6 inches) and 48.26 millimeters (1.9 inches), such as between 43.18 millimeters (1.7 inches) and 45.72 millimeters (1.8 inches), such as between 43.942 millimeters (1.73 inches) and 44.45 millimeters (1.75 inches). A height of the cylindrical portion of the extended coaxial input connector conductor, from bottom circular conductor edge 707 to bottom rear base surface 808 of FIG. 8 and from bottom circular conductor edge 707 to bottom right base surface 909 or bottom left base surface 910 of FIG. 9, can be between 33.02 millimeters (1.3 inches) and 43.18 millimeters (1.7 inches), such as between 35.56 millimeters (1.4 inches) and 40.64 millimeters (1.6 inches), such as between 37.592 millimeters (1.48 inches) and 38.1 millimeters (1.50 inches).

FIG. 10 is a front end view of a multiview orthographic projection diagram of an extended coaxial input connector lower dielectric housing portion to accommodate a cooling block in accordance with at least one embodiment. Front end view 1000 shows front top edge 1081, front left edge 1087, and front right edge 1089. Bottom circular dielectric edge 1007, inner cylindrical dielectric surface 1011, and outer cylindrical dielectric surface 1014 are shown in front end view 1000. A portion of the extended coaxial input connector lower dielectric housing portion is relieved to accommodate the extended coaxial input connector conductor, a conductive strap for connecting it with the input of the fixed impedance matching network, a conductor strap for connecting the output of the fixed impedance matching network to an output conductor base, and the output conductor base. A top relieved planar area 1031 is shown in front end view 1000. Intersecting the top relieved planar area 1031 are top right input conductor relieved region wall 1032, top left input conductor relieved region wall 1033, top right output conductor relieved region wall 1034, top left output conductor relieved region wall 1035, and top left output conductor radiused relieved region wall 1036. An output conductor base set screw access trough is defined to provide access to the output conductor base set screw, which secures an output coaxial center conductor to provide the output of the adapter to the load, which may be, for example, a plasma chamber.

FIG. 11 is a top view of a multiview orthographic projection diagram of an extended coaxial input connector lower dielectric housing portion to accommodate a cooling block in accordance with at least one embodiment. Top view 1100 includes front top edge 1181, top right edge 1182, top left edge 1183, and rear top edge 1184. The top circular edge of inner cylindrical dielectric surface 1011 is visible from top view 1000, while outer cylindrical dielectric surface 1014 is drawn as a broken circle to indicate its position under the base portion of the extended coaxial input connector lower dielectric housing portion.

Mounting holes are defined in the extended coaxial input connector lower dielectric housing portion. The mounting holes include front dielectric housing mounting hole 1141, rear left dielectric housing mounting hole 1142, and rear right dielectric housing mounting hole 1143. Such mounting holes can accept screws, which can secure extended coaxial input connector lower dielectric housing portion together with a coaxial input connector upper dielectric housing portion and attach them within the adapter. Dowel pin holes are defined in the extended coaxial input connector lower dielectric housing portion. Front left dielectric housing dowel pin hole 1144 and rear right dielectric housing dowel pin hole 1145 are illustrated.

Portions of the extended coaxial input connector lower dielectric housing portion are relieved to provide cavities in which the extended coaxial input connector conductor, a conductive strap for connecting it with the input of the fixed impedance matching network, a conductor strap for connecting the output of the fixed impedance matching network to an output conductor base, and the output conductor base are disposed. A relieved region for the extended coaxial input connector and its conductive strap is defined by front top input conductor relieved region wall edge 1146, front top left input conductor radiused relieved region wall edge 1147, top left input conductor relieved region wall edge 1168, rear top left input conductor radiused relieved region wall edge 1148, rear top left input conductor relieved region wall edge 1149, rear top input conductor radiused relieved region wall edge 1150, rear top right input conductor relieved region wall edge 1151, rear top right input conductor radiused relieved region wall edge 1152, top right input conductor relieved region wall edge 1153, and front top right input conductor relieved region wall edge 1154.

A relieved region for the output conductor base and its conductive strap is defined by front top output strap relieved region wall edge 1156, top right output conductor base relieved region wall edge 1157, front top right output conductor base radiused relieved region wall edge 1158, front top output conductor base radiused relieved region wall edge 1159, front top left output conductor base radiused relived region wall edge 1160, front top left output conductor base relieved region wall edge 1161, middle top left output conductor base radiused relieved region wall edge 1162, middle top left output conductor base relieved region wall edge 1163, rear top left output conductor base radiused relieved region wall edge 1164, rear top left output conductor base relieved region wall edge 1165, and far rear left output conductor base radiused relieved region wall edge 1167. The relieved region for the output conductor base and its conductive strap may define a region of deeper relief over top output conductor relieved area 1155.

Exemplary dimensions in accordance with at least one embodiment can include those set forth below. A height of the extended coaxial input connector lower dielectric housing portion, from bottom circular dielectric edge 1007 to front top edge 1081 of FIG. 10, can be between 38.1 millimeters (1.5 inches) and 45.72 millimeters (1.8 inches), such as between 40.64 millimeters (1.6 inches) and 44.45 millimeters (1.75 inches), such as between 41.2496 millimeters (1.624 inches) and 43.7896 millimeters (1.724 inches). A height of the cylindrical portion of the extended coaxial input connector lower dielectric housing portion, from bottom circular dielectric edge 1007 to bottom front base edge 1001, can be between 27.94 millimeters (1.1 inches) and 38.1 millimeters (1.5 inches), such as between 30.48 millimeters (1.2 inches) and 35.56 millimeters (1.4 inches), such as between 32.0548 millimeters (1.262 inches) and 34.5948 millimeters (1.362 inches).

FIG. 12 is a front end view of a multiview orthographic projection diagram of a rear extended mounting bracket to accommodate a cooling block in accordance with at least one embodiment. Front end view 1200 shows the rear extended mounting bracket includes a locking pivot portion and a relieved attachment portion. The relieved attachment portion can attach the adapter, with the cooling block, to, for example, an RF source, such as a plasma generator. Front end view 1200 shows bottom front edge 1201, left front edge 1202, top front radiused edge 1203, and right front edge 1204. The locking pivot portion includes pivot hole 1205 defined in the rear extended mounting bracket and a locking dog defined by top front locking dog edge 1206, front right locking dog edge 1207, and bottom front locking dog edge 1208. Bottom front edge 1201, left front edge 1202, right front edge 1204, and bottom front locking dog edge 1208 give the rear extended mounting bracket a substantially rectangular shape. The relieved attachment portion includes a front relieved planar area 1219 and is defined by bottom front left radiused relieved region wall edge 1209, bottom front left relieved region wall edge 1210, bottom front radiused relieved region wall edge 1211, bottom front right relieved region wall edge 1212, bottom front right radiused relieved region wall edge 1213, top front left radiused relieved region wall edge 1214, top front left relieved region wall edge 1215, top front radiused relieved region wall edge 1216, top front right relieved region wall edge 1217, and top front right radiused relieved region wall edge 1218. The relieved attachment portion is substantially T-shaped.

FIG. 13 is a right side view of a multiview orthographic projection diagram of a rear extended mounting bracket to accommodate a cooling block in accordance with at least one embodiment. Right side view 1300 shows front right edge 1321, rear right edge 1322, bottom right edge 1341, and top radiused surface 1343. The relieved attachment portion is shown by front right relieved planar area edge 1349, front right retention lip edge 1323, bottom front right radiused retention lip edge 1324, bottom right radiused retention lip edge 1325, bottom right radiused retention lip surface 1326, bottom rear right radiused retention lip edge 1327, top front right radiused retention lip edge 1328, top right radiused retention lip surface 1329, top right radiused retention lip edge 1330, and top rear right radiused retention lip edge 1331.

Exemplary dimensions in accordance with at least one embodiment can include those set forth below. A distance between a pivot point at the axis of pivot hole 1205 of FIG. 12 and a bottom right radiused retention lip surface 1326 of FIG. 13 can be between 38.1 millimeters (1.5 inches) and 45.72 millimeters (1.8 inches), such as between 39.37 millimeters (1.55 inches) and 43.18 millimeters (1.7 inches), such as between 39.751 millimeters (1.565 inches) and 42.291 millimeters (1.665 inches).

FIG. 14 is a rear end view of a multiview orthographic projection diagram of a front extended mounting bracket to accommodate a cooling block in accordance with at least one embodiment. Rear end view 1400 shows the front extended mounting bracket includes a fixed mounting portion and a relieved attachment portion. The fixed mounting portion comprises a raised portion extending toward the rear which defines a screw hole and two dowel pin holes. The relieved attachment portion comprises relieved features and can attach the adapter, with the cooling block, to, for example, an RF source, such as a plasma generator. Rear end view 1400 shows bottom rear edge 1404, left rear edge 1490, top rear edge 1484, and right rear edge 1488. Bottom rear edge 1404, left rear edge 1490, top rear edge 1484, and right rear edge 1488 give the front extended mounting bracket a substantially rectangular shape. The raised portion is surrounded by bottom rear raised area edge 1471, rear right raised area edge 1472, rear left raised area edge 1474, and top rear edge 1484. Defined within the raised portion are rear screw hole edge 1405, rear right dowel pin hole edge 1465, and rear left dowel pin hole edge 1475. The relieved attachment portion includes a rear relieved planar area 1419 and is defined by bottom rear left radiused relieved region wall edge 1409, bottom rear left relieved region wall edge 1410, bottom rear radiused relieved region wall edge 1411, bottom rear right relieved region wall edge 1412, bottom rear right radiused relieved region wall edge 1413, top rear left radiused relieved region wall edge 1414, top rear left relieved region wall edge 1415, top rear radiused relieved region wall edge 1416, top rear right relieved region wall edge 1417, and top rear right radiused relieved region wall edge 1418. The relieved attachment portion is substantially T-shaped. The retention lip at the lower extreme of the front extended mounting bracket is defined by bottom rear edge 1404, rear left retention lip wall edge 1459, rear right retention lip wall edge 1463, bottom rear left radiused relieved region wall edge 1409, bottom rear left relieved region wall edge 1410, bottom rear radiused relieved region wall edge 1411, bottom rear right relieved region wall edge 1412, and bottom rear right radiused relieved region wall edge 1413.

Figure 15:
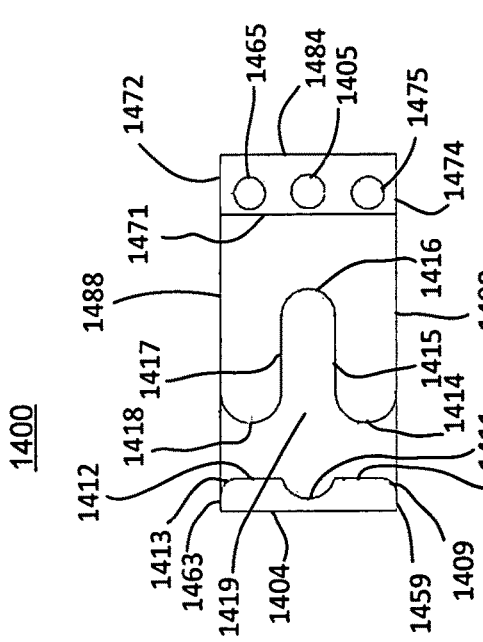
FIG. 15 is a left side view of a multiview orthographic projection diagram of a front extended mounting bracket to accommodate a cooling block in accordance with at least one embodiment.

FIG. 15 is a left side view of a multiview orthographic projection diagram of a front extended mounting bracket to accommodate a cooling block in accordance with at least one embodiment. Left side view 1500 shows front left edge 1589, left rear edge 1490, bottom left edge 1503, and top left edge 1583. Adjacent to rear left edge 1590 on the upper side is bottom left raised area edge 1552 extending rearward to the raised portion, along which rear left raised area edge 1474 lies. The relieved attachment portion is shown by front left relieved planar area edge 1549, front left retention lip edge 1523, bottom rear left radiused retention lip edge 1524, bottom left radiused retention lip edge 1525, bottom left radiused retention lip surface 1526, bottom front left radiused retention lip edge 1527, top rear left radiused retention lip edge 1528, top left radiused retention lip surface 1529, top left radiused retention lip edge 1530, and top front left radiused retention lip edge 1531.

Figure 16:
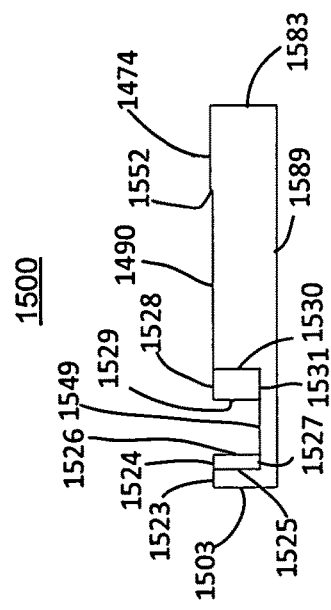
FIG. 16 is a front end view of a multiview orthographic projection diagram of a front extended mounting bracket to accommodate a cooling block in accordance with at least one embodiment.

FIG. 16 is a front end view of a multiview orthographic projection diagram of a front extended mounting bracket to accommodate a cooling block in accordance with at least one embodiment. Front end view 1600 shows bottom front edge 1601, top front edge 1681, front right edge 1687, and front left edge 1589. Defined within a front face of the front extended mounting bracket are front screw hole edge 1605, front right dowel pin hole edge 1665, and front left dowel pin hole edge 1675.

Exemplary dimensions in accordance with at least one embodiment can include those set forth below. A distance between the axis of a screw hole defined by front screw hole edge 1405 of FIG. 14 and a bottom left radiused retention lip surface 1526 of FIG. 15 can be between 38.1 millimeters (1.5 inches) and 45.72 millimeters (1.8 inches), such as between 39.37 millimeters (1.55 inches) and 43.18 millimeters (1.7 inches), such as between 39.9542 millimeters (1.573 inches) and 42.4942 millimeters (1.673 inches).

Figure 17:
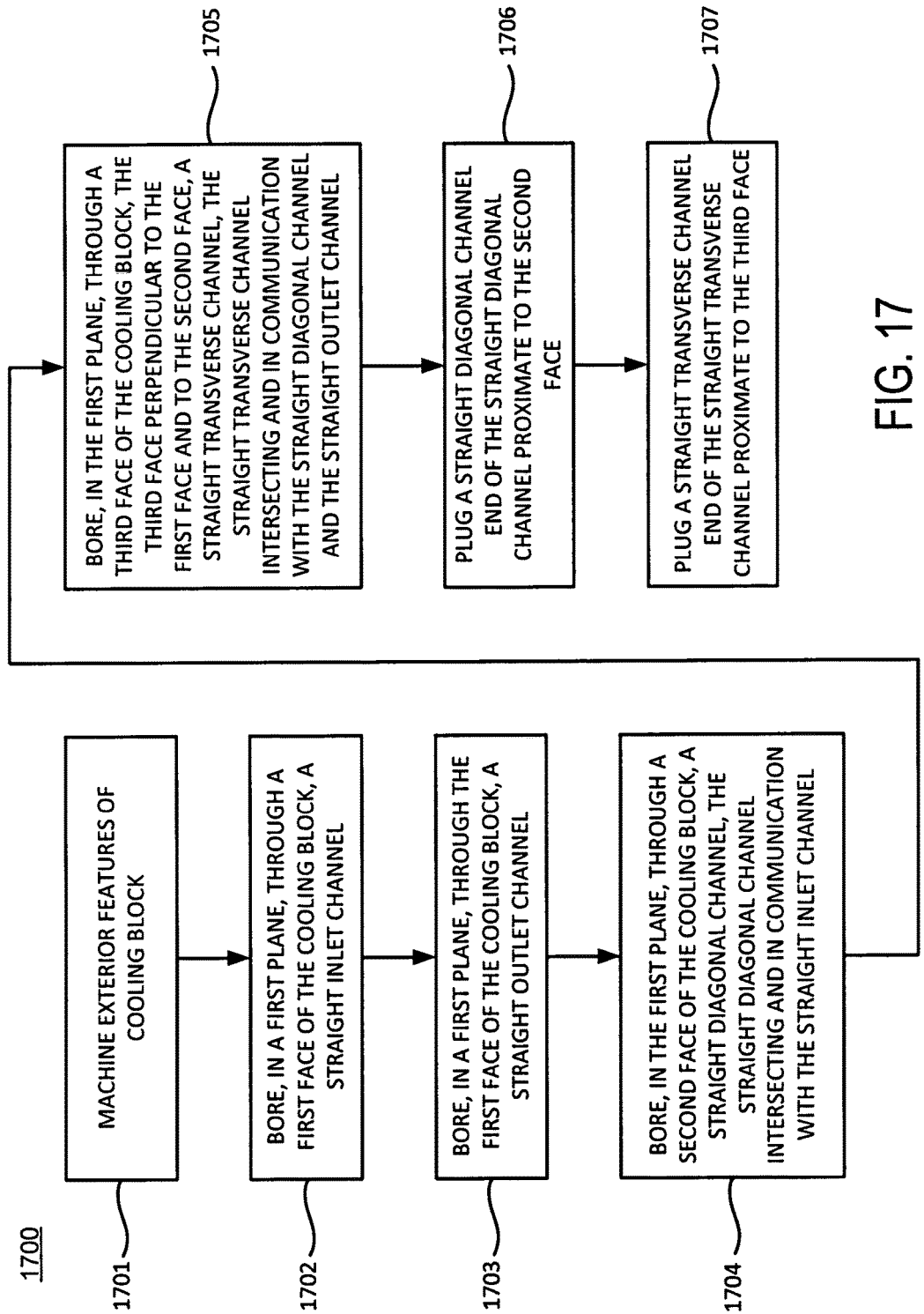
FIG. 17 is a flow diagram illustrating a method in accordance with at least one embodiment.

FIG. 17 is a flow diagram illustrating a method in accordance with at least one embodiment. Method 1700 begins at block 1701. At block 1701, exterior features of the cooling block are machined. From block 1701, method 1700 continues to block 1702. At block 1702, a straight inlet channel is bored, in a first plane, though a first face of the cooling block. From block 1702, method 1700 continues to block 1703. At block 1703, a straight outlet channel is bored, in the first plane, through the first face of the cooling block. From block 1703, method 1700 continues to block 1704. At block 1704, a straight diagonal channel is bored, in the first plane, through a second face of the cooling block. The straight diagonal channel intersects and is in communication with the straight inlet channel. From block 1704, method 1700 continues to block 1705. At block 1705, a straight transverse channel is bored, in the first plane, through a third face of the cooling block. The third face is perpendicular to the first face and to the second face. The straight transverse channel intersects and is in communication with the straight diagonal channel and the straight outlet channel. From block 1705, method 1700 continues at block 1706. At block 1706, a straight diagonal channel end of the straight diagonal channel proximate to the second face is plugged. From block 1706, method 1700 continues at block 1707. At block 1707, a straight transverse channel end of the straight transverse channel proximate to the third face is plugged. As examples for blocks 1705 and 1706, the channel ends may be plugged by a plug, such as a threaded plug, a press-fit plug, a swaged plug, a crimped plug, a soldered plug, a brazed plug, a welded plug, or another plug.

In accordance with at least one embodiment, the boring the straight diagonal channel and the boring the straight transverse channel are performed at an acute angle with respect to each other. In accordance with at least one embodiment, the boring the straight inlet channel and the boring the straight outlet channel are performed at an angle of zero to thirty degrees with respect to each other. In accordance with at least one embodiment, the first plane is substantially parallel to a fourth face and a fifth face of the cooling block.

Figure 18:
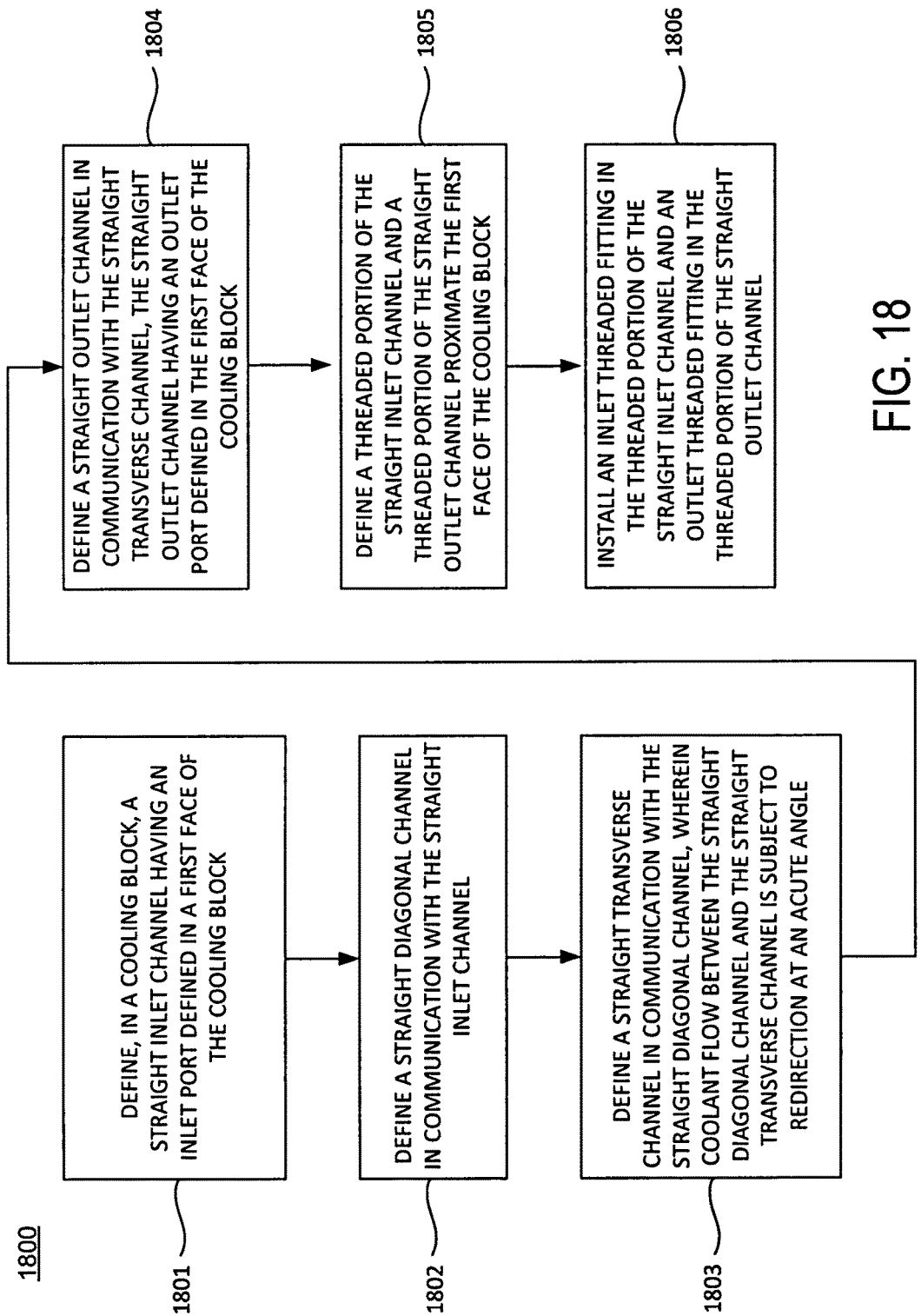
FIG. 18 is a flow diagram illustrating a method in accordance with at least one embodiment.

FIG. 18 is a flow diagram illustrating a method in accordance with at least one embodiment. Method 1800 begins at block 1801. At block 1801, a straight inlet channel is defined in the cooling block. The straight inlet channel has an inlet port defined in a first face of the cooling block. From block 1801, method 1800 continues to block 1802. At block 1802, a straight diagonal channel is defined. The straight diagonal channel is in communication with the straight inlet channel. From block 1802, method 1800 continues to block 1803. At block 1803, a straight transverse channel is defined. The straight transverse channel is in communication with the straight diagonal channel. Coolant flow between the straight diagonal channel and the straight transverse channel is subject to redirection at an acute angle. From block 1803, method 1800 continues to block 1804. At block 1804, a straight outlet channel is defined. The straight outlet channel is in communication with the straight transverse channel. The straight outlet channel has an outlet port defined in the first face of the cooling block. From block 1804, method 1800 continues to block 1805. At block 1805, an inlet threaded portion of the straight inlet channel is defined proximate to the first face of the cooling block, and an outlet threaded portion of the straight outlet channel is defined proximate to the first face of the cooling block. As an example, the inlet threaded portion and the outlet threaded portion may be tapped into the straight inlet channel and the straight outlet channel, respectively. From block 1805, method 1800 continues at block 1806. At block 1806, an inlet threaded fitting is installed in the inlet threaded portion of the straight inlet channel, and an outlet threaded fitting is installed in the outlet threaded portion of the straight outlet channel.

In accordance with at least one embodiment, the coolant flow between the straight diagonal channel and the straight transverse channel is subject to redirection at the acute angle between 30 degrees and 60 degrees. In accordance with at least one embodiment, the coolant flow between the straight diagonal channel and the straight transverse channel is subject to redirection at the acute angle between 40 and 50 degrees. In accordance with at least one embodiment, the coolant flow between the straight transverse channel and the straight outlet channel is subject to redirection at an angle between 80 and 100 degrees.

In accordance with at least one embodiment, the matching network comprises reactive components, such as at least one inductive component and at least one capacitive component. The reactive components can match the output impedance of the power source to the input impedance of the load. While the reactive components may be substantially purely reactive, non-ideal properties of the materials of which they are constructed, such as the relatively small resistivity of highly conductive metals or alloys, can result in an undesired resistance, which can result in loss and power dissipation within the matching network. The cooling block can be used to remove heat from such power dissipation within the matching network.

In accordance with at least one embodiment, the cooling block is fabricated of a highly thermally conductive material, such as a material exhibiting a thermal conductivity in excess of 100 watts per meter Kelvin (W/m-K), such as in excess of 120 W/m-K. Examples of suitable materials include aluminum, copper, and brass, among others. The surface of the cooling block may be modified by a treatment such as anodizing or plating, for example, nickel plating. The matching network may include components constructed on a substrate, for example, on a ceramic substrate, such as an alumina substrate. The substrate may be mounted on the cooling block. Metallic material may be provided on the surface of the substrate. On one surface of the substrate, the metallic material may be patterned to provide electrical features for the matching network, such as inductors and pads for attaching capacitors. On an opposite surface of the substrate, the metallic material may be patterned to provide features that may be of an electrical nature, a thermal nature, or both. For example, one or more features may serve as an electrical ground plane for the matching network and may also serve thermally as a heat spreader to spread heat over a larger area for more effective heat transfer. A heat sink compound may be used to promote heat transfer from the heat spreader feature to the cooling block.

The cooling block is configured to provide cooling for a radio frequency (RF) matching network. The coolant is a cooling medium passed through the cooling block to extract heat from the cooling block. As an example, the coolant may be circulated through the cooling block, through a chiller to remove the heat from the coolant, then back to the cooling block or other process equipment to remove additional heat. Coolant is introduced into the cooling block at threaded inlet port 126. The coolant flows through straight inlet channel 114 to inlet and diagonal channel junction 129. From inlet and diagonal channel junction 129, the coolant flows through straight diagonal channel 113 to diagonal and transverse channel junction 128. From diagonal and transverse channel junction 128, the coolant flows through straight transverse channel 112 to transverse and outlet channel junction 127. From transverse and outlet channel junction 127, the coolant flows through straight outlet channel 111 to threaded outlet port 123. The coolant exits the cooling block at threaded outlet port 123. Examples of coolants include water, water and glycol mixtures, fluorocarbon fluids, perfluorinated polyethers, hydrofluoroethers (HFEs), fluoroketones, polyalphaolefins (PAOs), and oils.

The channels provided for coolant flow through the cooling block can have a flow capacity compatible with connection of the cooling block in series with, in parallel with, or either in series or in parallel with other cooling components in a cooling system. For example, a channel diameter between 7.62 millimeters (0.3 inch) and 12.7 millimeters (0.5 inch), such as between 8.89 millimeters (0.35 inch) and 11.43 millimeters (0.45 inch), such as between 8.89 millimeters (0.35 inch) and 10.16 millimeters (0.40 inch) or between 10.16 millimeters (0.40 inch) and 11.43 millimeters (0.45 inch), for example, 9.525 millimeters (3/8 inch) or 11.1125 millimeters (7/16 inch), can allow coolant flow of at least one gallon per minute, which can be sufficient to promote adequate coolant flow in either a series or parallel configuration with other cooling components. Alternatively, the cooling block can be configured by itself, without serial or parallel connections to other cooling components. An inlet and an outlet can be threaded, for example, in accordance with National Pipe Thread (NPT) specifications to accommodate, for example, a 6.35 millimeter (¼ inch) male NPT fitting. As another example, other types of fittings may be connected to the cooling block, such as at least one compression fitting, at least one quick disconnect fitting, or at least one other type of fitting. Such fittings may be connected directly to the cooling block or via adapters from fittings that connect to the cooling block, such as the NPT fittings described above.

In accordance with at least one embodiment, diagonal bore axis 121 intersects transverse bore axis 120 at an acute angle. As examples, the intersection may occur at an angle of between 44 and 46 degrees, between 40 and 50 degrees, between 35 and 55 degrees, or between 30 and 60 degrees. In accordance with at least one embodiment, one or more of the straight channels may be defined with a bore having a diameter of between 9.398 millimeters (0.37 inch) and 9.652 millimeters (0.38 inch), of between 8.89 millimeters (0.35 inch) and 10.16 millimeters (0.40 inch), or of between 7.62 millimeters 10.3 inch) and 11.43 millimeters (0.45 inch). In accordance with at least one embodiment, a minimum wall thickness is maintained between any portion of the surfaces of the straight channels and the nearest portions of the top and bottom surfaces of the cooling block. As examples, the minimum wall thickness is between 1.27 millimeter (0.05 inch) and 3.81 millimeters 10.15 inch), between 1.27 millimeter (0.05 inch) and 2.54 millimeters (0.10 inch), between 1.27 millimeter (0.05 inch) and 1.778 millimeter (0.07 inch), between 13.97 millimeters (0.55 inch) and 16.51 millimeters (0.65 inch), or between 14.986 millimeters (0.59 inch) and 15.494 millimeters (0.61 inch). In accordance with at least one embodiment, the minimum wall thickness provides an operating coolant pressure of up to 689470 Pascals 1100 pounds per square inch (PSI)). In accordance with at least one embodiment, the minimum wall thickness allows coolant pressure testing at pressures up to 2068410 Pascals (300 psi) to insure no leakage over a period of time, such as 600 seconds (10 minutes).

In accordance with at least one embodiment, a cooling block comprises a substantially rectangular block. As used herein, a substantially rectangular block is understood to be a block having a top planar surface, a bottom planar surface, a front surface, a rear surface, a left surface, and a right surface, although portions of at least one of the surfaces may be modified, for example, by removing a relieved portion, a radiused portion, other portions, or the like. As an example, the substantially rectangular block may be a radiused relieved rectangular block defining a plurality of straight channels. The straight channels include an inlet channel, a diagonal channel, a transverse channel, and an outlet channel. The straight channels are serially communicative to provide a continuous path for coolant flow. The diagonal channel meets the transverse channel at an acute angle at a diagonal and transverse channel junction.

In accordance with at least one embodiment, a continuous path leads from the inlet channel to the diagonal channel to the transverse channel to the output channel. In accordance with at least one embodiment, the acute angle is between 30 degrees and 60 degrees. In accordance with at least one embodiment, the acute angle is between 40 and 50 degrees. In accordance with at least one embodiment, a diagonal channel end of the diagonal channel is plugged with a diagonal channel end plug and a transverse channel end of the transverse channel is plugged with a transverse channel end plug. In accordance with at least one embodiment, a transverse dead end channel portion of the transverse channel is defined between the transverse channel end plug and the diagonal and transverse channel junction. The transverse dead end channel portion has a transverse dead end channel portion length along a transverse channel axis of at least one inch. In accordance with at least one embodiment, a diagonal dead end channel portion of the diagonal channel is defined between the diagonal channel end plug and the diagonal and transverse channel junction. The diagonal dead end channel portion has a diagonal dead end channel portion length along a diagonal channel axis of at least 5.08 millimeters (0.2 inch). In accordance with at least one embodiment, the acute angle promotes turbulence in the coolant flow. In accordance with at least one embodiment, the inlet channel terminates at an inlet port and the outlet channel terminates at an outlet port. The inlet port and the outlet port are defined in a first face of the cooling block. In accordance with at least one embodiment, a port spacing distance between the inlet port and the outlet port is between 25.4 millimeters (1 inch) and 50.8 millimeters (2 inches). In accordance with at least one embodiment, a diameter of the straight channels is between 6.35 millimeters (0.25 inch) and 11.43 millimeters (0.45 inch) and the cooling block has a thickness of between 12.7 millimeters (0.5 inch) and 20.32 millimeters (0.8 inch) between a top planar face and a bottom planar face. In accordance with at least one embodiment, the transverse channel meets the outlet channel at an angle between 80 and 100 degrees.

In accordance with at least one embodiment, a method comprises defining, in a cooling block, a straight inlet channel having an inlet port defined in a first face of the cooling block, defining a straight diagonal channel in communication with the straight inlet channel, defining a straight transverse channel in communication with the straight diagonal channel, wherein coolant flow between the straight diagonal channel and the straight transverse channel is subject to redirection at an acute angle, and defining a straight outlet channel in communication with the straight transverse channel, the straight outlet channel having an outlet port defined in the first face of the cooling block. In accordance with at least one embodiment, the coolant flow between the straight diagonal channel and the straight transverse channel is subject to redirection at the acute angle between 30 degrees and 60 degrees. In accordance with at least one embodiment, the coolant flow between the straight diagonal channel and the straight transverse channel is subject to redirection at the acute angle between 40 and 50 degrees. In accordance with at least one embodiment, the coolant flow between the straight transverse channel and the straight outlet channel is subject to redirection at an angle between 80 and 100 degrees.

In accordance with at least one embodiment, a method comprises boring, in a first plane, through a first face of a cooling block, a straight inlet channel, boring, in the first plane, through the first face of the cooling block, a straight outlet channel, boring, in the first plane, through a second face of the cooling block, a straight diagonal channel, the straight diagonal channel intersecting and in communication with the straight inlet channel, boring in the first plane, through a third face of the cooling block, the third face perpendicular to the first face and to the second face, a straight transverse channel, the straight transverse channel intersecting and in communication with the straight diagonal channel and the straight outlet channel, plugging a straight diagonal channel end of the straight diagonal channel proximate to the second face, and plugging a straight transverse channel end of the straight transverse channel proximate to the third face.

In accordance with at least one embodiment, the boring the straight diagonal channel and the boring the straight transverse channel are performed at an acute angle with respect to each other. In accordance with at least one embodiment, the boring the straight inlet channel and the boring the straight outlet channel are performed at an angle of zero to thirty degrees with respect to each other. In accordance with at least one embodiment, the first plane is substantially parallel to a fourth face and a fifth face of the cooling block.

The concepts of the present disclosure have been described above with reference to specific embodiments. However, one of ordinary skill in the art will appreciate that various modifications and changes can be made without departing from the scope of the present disclosure as set forth in the claims below. As an example, while ports are referred to as an inlet port and an outlet port, the flow of coolant between the ports could occur in either direction. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:
1. A cooling block comprising:
 a metal block defining a plurality of straight channels, the plurality of straight channels comprising an inlet channel, a diagonal channel, a transverse channel, and an outlet channel, the plurality of straight channels being serially communicative to provide a continuous path for coolant flow, wherein the inlet channel meets the diagonal channel at an inlet and diagonal channel junction, wherein the diagonal channel meets the transverse channel at an acute angle at a diagonal and transverse channel junction, wherein the transverse channel intersects the outlet channel at a transverse and outlet channel angle between 75 and 105 degrees at a transverse and outlet channel junction, and wherein the inlet channel intersects the diagonal channel at an obtuse angle with respect to a path of coolant flow, the metal block having a top planar surface and a bottom planar surface opposite the top planar surface, wherein the inlet channel is bored, in a first plane, through a first face of the cooling block and the outlet channel is bored, in the first plane, through the first face of the cooling block, wherein an inlet bore axis of the inlet channel and an outlet bore axis of the outlet channel are spaced apart from each other along the first face of the cooling block by a distance of between 1.2 and 1.5 inches; and
 a front extended mounting bracket coupled to the metal block, the front extended mounting bracket comprising a front fixed mounting portion and a front relieved attachment portion, the front relieved attachment portion for attachment to a radio frequency (RF) source, the front extended mounting bracket configured to be mounted to the first face of the metal block via a screw hole defined in the front extended mounting bracket and a front center bracket mounting hole defined in the first face of the metal block.

2. The cooling block of claim 1 wherein a continuous path leads from the inlet channel to the diagonal channel to the transverse channel to the outlet channel.

3. The cooling block of claim 1 wherein the acute angle is between 30 degrees and 60 degrees.

4. The cooling block of claim 1 wherein the acute angle is between 40 and 50 degrees.

5. The cooling block of claim 1 wherein a diagonal channel end of the diagonal channel is plugged with a diagonal channel end plug and a transverse channel end of the transverse channel is plugged with a transverse channel end plug.

6. The cooling block of claim 5 wherein a transverse dead end channel portion of the transverse channel is defined between the transverse channel end plug and the diagonal and transverse channel junction, the transverse dead end channel portion having a transverse dead end channel portion length along a transverse channel axis of at least one inch.

7. The cooling block of claim 6 wherein a diagonal dead end channel portion of the diagonal channel is defined between the diagonal channel end plug and the diagonal and transverse channel junction, the diagonal dead end channel portion having a diagonal dead end channel portion length along a diagonal channel axis of at least 0.2 inch.

8. The cooling block of claim 1 wherein the acute angle promotes turbulence in the coolant flow.

9. The cooling block of claim 1 wherein a diameter of the plurality of straight channels is between 0.25 inch and 0.45 inch and wherein the cooling block has a thickness of between 0.5 inch and 0.8 inch between the top planar surface and the bottom planar surface.

10. The cooling block of claim 1 wherein the transverse channel meets the outlet channel at an angle between 80 and 100 degrees.

11. The cooling block of claim 1, wherein the front fixed mounting portion comprises a raised portion defining the screw hole and two dowel pin holes.

12. The cooling block of claim 11, wherein the two dowel pin holes are defined by a front right dowel pin hole edge and a front left dowel pin hole edge, respectively.

13. The cooling block of claim 1 further comprising:
a rear extended mounting bracket coupled to the metal block, the rear extended mounting bracket comprising a rear locking pivot portion and a rear relieved attachment portion, the rear relieved attachment portion for attachment to the RF source, the rear extended mounting bracket configured to be mounted to the metal block via a rear mounting bracket hole defined in the metal block.

14. The cooling block of claim 13 wherein the rear locking pivot portion defines a pivot hole and comprises a locking dog.

15. The cooling block of claim 14 wherein the rear relieved attachment portion defines a bottom right radiused retention lip surface, and a first distance between the bottom right radiused retention lip surface and a pivot point at a pivot hole axis of the pivot hole is between 1.5 and 1.8 inches.

16. The cooling block of claim 15 wherein the front fixed mounting portion comprises a raised portion defining the screw hole and two dowel pin holes, the front relieved attachment portion defines a bottom left radiused retention lip surface, and a second distance between the bottom left radiused retention lip surface and a screw hole axis of the screw hole is between 1.5 and 1.8 inches.

17. The cooling block of claim 13 wherein the rear extended mounting bracket is of a substantially rectangular shape, the front extended mounting bracket is of a substantially rectangular shape, the rear relieved attachment portion is substantially T-shaped, and the front relieved attachment portion is substantially T-shaped.

18. A cooling block comprising:
a metal block defining a plurality of straight channels, the plurality of straight channels comprising an inlet channel, a diagonal channel, a transverse channel, and an outlet channel, the plurality of straight channels being serially communicative to provide a continuous path for coolant flow, wherein the inlet channel meets the diagonal channel at an inlet and diagonal channel junction, wherein the diagonal channel meets the transverse channel at an acute angle at a diagonal and transverse channel junction, wherein the transverse channel intersects the outlet channel at a transverse and outlet channel angle between 75 and 105 degrees at a transverse and outlet channel junction, and wherein the inlet channel intersects the diagonal channel at an obtuse angle with respect to a path of coolant flow, the metal block having a top planar surface and a bottom planar surface opposite the top planar surface; and
a front extended mounting bracket coupled to the metal block, the front extended mounting bracket comprising a fixed mounting portion and a relieved attachment portion, the relieved attachment portion for attachment to a radio frequency (RF) source, the front extended mounting bracket configured to be mounted to a first face of the metal block via a screw hole defined in the front extended mounting bracket and a front center bracket mounting hole defined in the first face of the metal block.

19. The cooling block of claim 18 further comprising:
a rear extended mounting bracket coupled to the metal block, the rear extended mounting bracket comprising a rear locking pivot portion and a rear relieved attachment portion, the rear relieved attachment portion for attachment to the RF source, the rear extended mounting bracket configured to be mounted to the metal block via a rear mounting bracket hole defined in the metal block.

20. The cooling block of claim 19 wherein the rear extended mounting bracket is of a substantially rectangular shape, the front extended mounting bracket is of a substantially rectangular shape, the rear relieved attachment portion is substantially T-shaped, and the front relieved attachment portion is substantially T-shaped.

* * * * *